United States Patent
Lin et al.

(10) Patent No.: US 6,980,876 B2
(45) Date of Patent: Dec. 27, 2005

(54) TEMPERATURE-SENSING WAFER POSITION DETECTION SYSTEM AND METHOD

(75) Inventors: Mu-Tsang Lin, Zhwengwei (TW); Kong-Hsin Teng, Beipu (TW); Tien-Wen Wang, Hsinchu (TW); Jen-Hom Chen, Hsinchu (TW)

(73) Assignee: Taiwan Semiconductor Manufacturing Co., Ltd., Hsin Chu (TW)

( * ) Notice: Subject to any disclaimer, the term of this patent is extended or adjusted under 35 U.S.C. 154(b) by 0 days.

(21) Appl. No.: 10/789,969

(22) Filed: Feb. 26, 2004

(65) Prior Publication Data

US 2005/0192699 A1 Sep. 1, 2005

(51) Int. Cl.[7] ............................................. G06F 19/00
(52) U.S. Cl. ................................. 700/121; 219/446.1
(58) Field of Search ............................... 700/121, 205, 700/278; 219/445.1, 446.1, 448.4; 438/550, 438/799

(56) References Cited

U.S. PATENT DOCUMENTS

| | | | | |
|---|---|---|---|---|
| 4,507,078 A | * | 3/1985 | Tam et al. | ...................... 432/11 |
| 5,885,353 A | * | 3/1999 | Strodtbeck et al. | ......... 118/712 |
| 6,100,506 A | * | 8/2000 | Colelli et al. | ............. 219/446.1 |
| 6,133,550 A | * | 10/2000 | Griffiths et al. | ............. 219/403 |
| 6,355,909 B1 | * | 3/2002 | Griffiths et al. | ............. 219/403 |
| 6,596,973 B1 | * | 7/2003 | Donald et al. | ............... 219/390 |
| 2004/0047993 A1 | * | 3/2004 | Kumar et al. | ............... 427/294 |

\* cited by examiner

*Primary Examiner*—Leo Picard
*Assistant Examiner*—Carlos Ortiz-Rodriguez
(74) *Attorney, Agent, or Firm*—Tung & Associates

(57) ABSTRACT

A temperature-sensing wafer position detection system and method which uses temperature to determine whether a wafer is properly positioned on a bake plate prior to commencement of a photolithography baking process, for example. The system includes a bake plate and a temperature-sensing apparatus which engages the bake plate and measures the change in temperature (ΔT) of the bake plate over a specified time interval to determine whether the wafer is properly or improperly positioned on the support. In the event that the ΔT of the bake plate is at least as great as a given temperature change threshold value over a specified time interval, this indicates that the wafer is properly positioned for processing.

20 Claims, 2 Drawing Sheets

TEMPERATURE-SENSING WAFER POSITION DETECTION SYSTEM AND METHOD

FIELD OF THE INVENTION

The present invention relates to systems and methods used to fabricate integrated circuits on semiconductor wafer substrates. More particularly, the present invention relates to a system and method which is capable of sensing the position of a wafer on a bake plate by measuring a temperature change in the bake plate after placement of a wafer onto the bake plate.

BACKGROUND OF THE INVENTION

The fabrication of various solid state devices requires the use of planar substrates, or semiconductor wafers, on which integrated circuits are fabricated. The final number, or yield, of functional integrated circuits on a wafer at the end of the IC fabrication process is of utmost importance to semiconductor manufacturers, and increasing the yield of circuits on the wafer is the main goal of semiconductor fabrication. After packaging, the circuits on the wafers are tested, wherein non-functional dies are marked using an inking process and the functional dies on the wafer are separated and sold. IC fabricators increase the yield of dies on a wafer by exploiting economies of scale. Over 1000 dies may be formed on a single wafer which measures from six to twelve inches in diameter.

Various processing steps are used to fabricate integrated circuits on a semiconductor wafer. These steps include deposition of a conducting layer on the silicon wafer substrate; formation of a photoresist or other mask such as titanium oxide or silicon oxide, in the form of the desired metal interconnection pattern, using standard lithographic or photolithographic techniques; subjecting the wafer substrate to a dry etching process to remove the conducting layer from the areas not covered by the mask, thereby etching the conducting layer in the form of the masked pattern on the substrate; removing or stripping the mask layer from the substrate typically using reactive plasma and chlorine gas, thereby exposing the top surface of the conductive interconnect layer; and cooling and drying the wafer substrate by applying water and nitrogen gas to the wafer substrate.

Photoresist materials are coated onto the surface of a wafer by dispensing a photoresist fluid typically on the center of the wafer as the wafer rotates at high speeds within a stationary bowl or coater cup. The coater cup catches excess fluids and particles ejected from the rotating wafer during application of the photoresist. The photoresist fluid dispensed onto the center of the wafer is spread outwardly toward the edges of the wafer by surface tension generated by the centrifugal force of the rotating wafer. This facilitates uniform application of the liquid photoresist on the entire surface of the wafer.

During the photolithography step of semiconductor production, light energy is applied through a reticle mask onto the photoresist material previously deposited on the wafer to define circuit patterns which will be etched in a subsequent processing step to define the circuits on the wafer. A reticle is a transparent plate patterned with a circuit image to be formed in the photoresist coating on the wafer. A reticle contains the circuit pattern image for only a few of the die on a wafer, such as four die, for example, and thus, must be stepped and repeated across the entire surface of the wafer. In contrast, a photomask, or mask, includes the circuit pattern image for all of the die on a wafer and requires only one exposure to transfer the circuit pattern image for all of the dies to the wafer.

The numerous processing steps outlined above are used to cumulatively apply multiple electrically conductive and insulative layers on the wafer and pattern the layers to form the circuits. The final yield of functional circuits on the wafer depends on proper application of each layer during the process steps. Proper application of those layers depends, in turn, on coating the material in a uniform spread over the surface of the wafer in an economical and efficient manner.

A typical method of forming a circuit pattern on a wafer includes introducing the wafer into the automated track system and then spin-coating a photoresist layer onto the wafer. The photoresist is next cured by conducting a soft bake process. After it is cooled, the wafer is placed in an exposure apparatus, such as a stepper, which aligns the wafer with an array of die patterns etched on the typically chrome-coated quartz reticle. When properly aligned and focused, the stepper exposes a small area of the wafer, then shifts or "steps" to the next field and repeats the process until the entire wafer surface has been exposed to the die patterns on the reticle. The photoresist is exposed to light through the reticle in the circuit image pattern. Exposure of the photoresist to this image pattern cross-links and hardens the resist in the circuit pattern. After the aligning and exposing step, the wafer is exposed to post-exposure baking and then is developed and hard-baked to develop the photoresist pattern.

The circuit pattern defined by the developed and hardened photoresist is next transferred to the underlying metal conductive layer using a metal etching process, in which metal over the entire surface of the wafer and not covered by the cross-linked photoresist is etched away from the wafer with the metal under the cross-linked photoresist that defines the circuit pattern protected from the etchant. As a result, a well-defined pattern of metallic microelectronic circuits which closely approximates the cross-linked photoresist circuit pattern remains in the metal layer.

Spin coating of photoresist on wafers, as well as the other steps in the photolithographty process, is typically carried out in an automated coater/developer track system using wafer handling equipment which transport the wafers between the various photolithography operation stations, such as vapor prime resist spin coat, develop, baking and chilling stations. Robotic handling of the wafers minimizes particle generation and wafer damage. Automated wafer tracks enable various processing operations to be carried out simultaneously. Two types of automated track systems widely used in the industry are the TEL (Tokyo Electron Limited) track and the SVG (Silicon Valley Group) track.

At the hard bake step of photolithography, a wafer transfer robot transfers the wafer onto a bake plate, which heats the wafer to a temperature of typically about 120–140 degrees C. for positive resists. The hard bake step evaporates the remaining photoresist solvent and improves adhesion of the resist to the wafer surface. The hard bake step stabilizes the resist following etch or implant processing. Both the bake plate target temperature and proper positioning of the wafer on the bake plate are critical for uniform thermal transmission from the bake plate to the wafer. Proper positioning of a wafer on a bake plate is particularly important for 0.13 $\mu$m technology applications and for wafers having a 12" diameter.

To ensure proper positioning of the wafer on the bake plate, the transfer position of the wafer onto the bake plate must typically be verified by a process engineer at each PM cycle. During processing, however, particles can fall off of wafers onto the bake plate and render abnormal the positioning of the wafer on the bake plate. Such abnormal positioning can be difficult to verify and is frequently manifested by a broken wafer or abnormal CD bias or uniformity in the devices fabricated on the wafer. Accordingly, a real-time wafer position-detecting system and method is needed to precisely indicate whether a wafer is properly positioned on a bake plate prior to commencement of a bake process in semiconductor photolithography.

An object of the present invention is to provide a novel real-time wafer position-detecting system which can be used to determine whether a wafer is properly positioned on a bake plate.

Another object of the present invention is to provide a novel wafer position-detecting system which is applicable to photolithography and other semiconductor processes.

Still another object of the present invention is to provide a novel temperature-sensing wafer position detection system.

Yet another object of the present invention is to provide a novel wafer position detection system which includes a bake plate and a temperature-sensing apparatus which engages the bake plate and measures the change in temperature ($\Delta T$) of the bake plate over a specified time interval to determine whether the wafer is properly or improperly positioned on the support.

A still further object of the present invention is to provide a real-time wafer position-detecting method which includes setting a bake plate at a temperature set point, transferring a wafer onto the bake plate, measuring the change in temperature ($\Delta T$) of the bake plate over a specified time interval, determining whether the wafer is improperly positioned on the wafer support based on the change in temperature, and aborting a bake process in the event that the wafer is improperly positioned on the bake plate.

SUMMARY OF THE INVENTION

In accordance with these and other objects and advantages, the present invention is generally directed to a novel temperature-sensing wafer position detection system which uses temperature to determine whether a wafer is properly positioned on a bake plate prior to commencement of a photolithography baking process, for example. The system includes a bake plate and a temperature-sensing apparatus which engages the bake plate and measures the change in temperature ($\Delta T$) of the bake plate over a specified time interval to determine whether the wafer is properly or improperly positioned on the support. In the event that the $\Delta T$ of the bake plate is equal to or greater than a given temperature change threshold value (such as 1% of the temperature set point for the bake plate) over a specified time period (such as 10 seconds), this indicates that the wafer is properly positioned for processing. In the event that the $\Delta T$ of the bake plate falls below the given temperature change threshold value over the specified time period, this indicates that the wafer is improperly positioned for processing and the bake process is aborted.

The present invention is further generally directed to a novel real-time wafer position-detecting method which includes setting a bake plate at a temperature set point, transferring a wafer onto the bake plate, measuring the change in temperature ($\Delta T$) of the bake plate over a specified time interval, determining whether the wafer is properly positioned on the bake plate based on the change in temperature, and aborting a bake process in the event that the wafer is improperly positioned on the bake plate. The system and method of the present invention ensures proper positioning of the wafer on the bake plate for optimum thermal transfer from the hot plate to the wafer during a photolithography bake process, for example.

BRIEF DESCRIPTION OF THE DRAWINGS

The invention will now be described, by way of example, with reference to the accompanying drawings, in which.

DETAILED DESCRIPTION OF THE INVENTION

Figure 1:
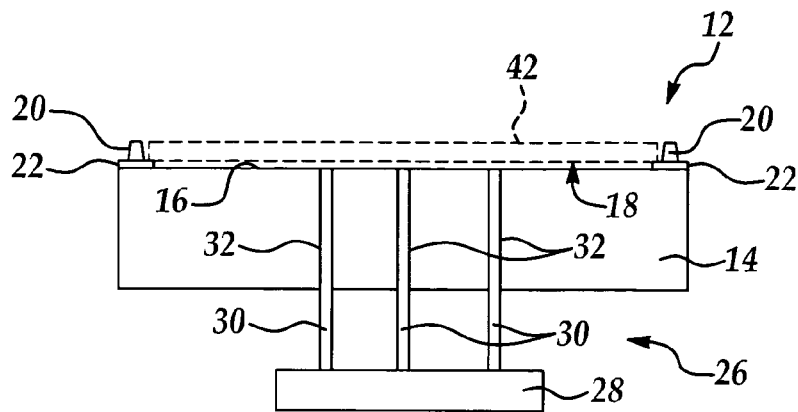
FIG. 1 is a cross-sectional, partially schematic, view of a bake plate element of the temperature-sensing wafer position detection system of the present invention.

The present invention contemplates a novel temperature-sensing wafer position detection system which uses a change in temperature over a specified time interval to determine whether a wafer is properly positioned on a bake plate prior to commencement of a photolithographic photoresist-baking process, for example. The system includes a bake plate and a temperature-sensing apparatus which engages the bake plate and measures the change in temperature ($\Delta T$) of the bake plate over a specified time interval after transfer of the wafer onto the bake plate. A microprocessor or computer is operably connected to the temperature-sensing apparatus to determine whether the wafer is properly or improperly positioned on the support, based on the $\Delta T$ of the bake plate over the specified time interval. The microprocessor may be operably connected to a system controller which controls the baking process in order to abort the process in the event that the wafer is improperly positioned on the bake plate.

In the event that the wafer is placed in a normal position on the bake plate, the normal placement position will be revealed by a bake plate $\Delta T$ which is equal to or greater than a given temperature change threshold value over the specified time period. Accordingly, processing of the wafer can proceed. On the other hand, placement of the wafer in an abnormal or improper position on the bake plate will be revealed by a bake plate $\Delta T$ which is less than the given temperature change threshold value over the specified time period. The bake process is then aborted and corrective measures are taken to ensure proper positioning of subsequent wafers on the bake plate.

The present invention further contemplates a novel real-time wafer position-detecting method which includes setting a bake plate at a temperature set point, transferring a wafer onto the bake plate, measuring the change in temperature of the bake plate over a specified time interval, determining whether the wafer is properly positioned on the bake plate based on the change in temperature, and aborting a bake process in the event that the wafer is improperly positioned on the bake plate.

The measured change in temperature (ΔT) of the bake plate is compared to a temperature change threshold value for a specified time period to determine whether the wafer is properly positioned on the bake plate. Preferably, the temperature change threshold value is 1% of the set point temperature over a time interval of 10 seconds. Normal positioning of the wafer on the bake plate is expressed by the following algorithm: ΔT>= Temperature set point×0.01 during 10 seconds after transfer of the wafer onto the bake plate. Accordingly, if the temperature of the bake plate rises by at least one percent of the set point temperature during the first ten seconds after transfer of the wafer onto the bake plate, then the wafer is properly positioned for the bake process.

Abnormal positioning of the wafer on the bake plate is expressed by the following algorithm: ΔT<Temperature set point×0.01 during 10 seconds after transfer of the wafer onto the bake plate. Accordingly, if the temperature of the bake plate fails to rise by at least one percent of the set point temperature during the first ten seconds after transfer of the wafer onto the bake plate, this indicates that the wafer is improperly positioned on the bake plate to begin the bake process. The bake process is then aborted and corrective measures are taken to ensure proper positioning of subsequent wafers on the bake plate.

An illustrative embodiment of the temperature-sensing wafer position detection system, hereinafter referred to as the system, of the present invention is generally indicated by reference numeral 10 in FIG. 2. The system 10 includes a bake plate 12 which supports and bakes a photoresist layer (not shown) on a semiconductor wafer 42 to harden and develop the photoresist in a photolithography process. The bake plate 12 includes a temperature-sensing apparatus 26. In operation of the system 10, which will be hereinafter described, the temperature-sensing apparatus 26 measures a change in temperature of the bake plate 12 after placement of a wafer 42 on the bake plate 12. This change in temperature indicates whether the wafer 42 is properly positioned on the bake plate 12 for implementation of the baking process.

A microprocessor 34 is operably connected to the temperature-sensing apparatus 26 for determining whether the wafer 42 is properly positioned on the bake plate 12 to begin the baking process, based on the change in temperature of the bake plate 12 over a selected time interval, as hereinafter described. A track system controller 36 controls the wafer transfer and baking processes. The track system controller 36 is operably connected to the microprocessor 34 for aborting the baking process in the event that the wafer 42 is improperly positioned on the bake plate 12, responsive to input from the microprocessor 34.

A wafer transfer robot 38 includes a robot arm 40 for carrying the wafer 42. The wafer transfer robot 38 is operably connected to the track system controller 36 for transferring the wafer 42 onto the bake plate 12, responsive to input from the track system controller 36.

The structural details of the bake plate 12 are shown in FIG. 1. The bake plate 12 includes a thermally-conductive plate body 14. Interior heating elements (not shown) provided in the plate body 14 are operably engaged by the track system controller 36 for heating the plate body 14 to a selected set point temperature, typically in conventional fashion. The plate body 14 has an upper heating surface 16 from which heat radiates by convection during operation of the bake plate 12. An annular wafer guide 20 extends from an annular base 22 which circumscribes the heating surface 16.

The temperature-sensing apparatus 26 includes a pyrometer support 28, from which extends multiple pyrometers 30. The pyrometers 30 extend through respective pyrometer openings 32 that extend through the plate body 14. The pyrometers 30 open onto the heating surface 16 and communicate with the heating space 18. Typically, the temperature-sensing apparatus 26 includes at least three pyrometers 30 which are substantially evenly distributed on the heating surface 16 to accurately measure the temperature of the heating surface 16, as hereinafter described.

As further shown in FIG. 1, in operation of the bake plate 12, which will be hereinafter further described, a wafer 42 (in phantom) normally rests on the base 22, inside the wafer guide 20. A heating space 18 is defined between the wafer 42 and the upper heating surface 16 of the plate body 14. When the wafer 42 is seated in the normal position on the base 22, heat radiates upwardly from the heating surface 16 and heats the wafer 42 by convection through the heating space 18. The wafer 42, wafer guide 20 and base 22 prevent most of the heat from escaping the heating space 18, such that the wafer 42 is heated to the set point temperature, which is selected typically using the track system controller 36.

Figure 2:
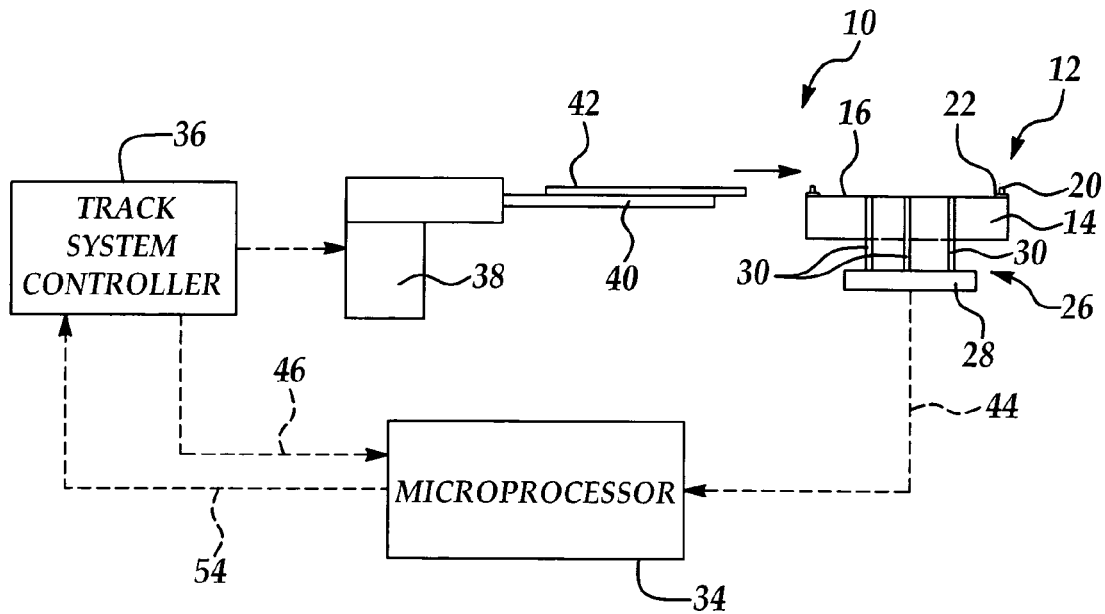
FIG. 2 is a schematic view of the wafer position detection system of the present invention.
Figure 3A:
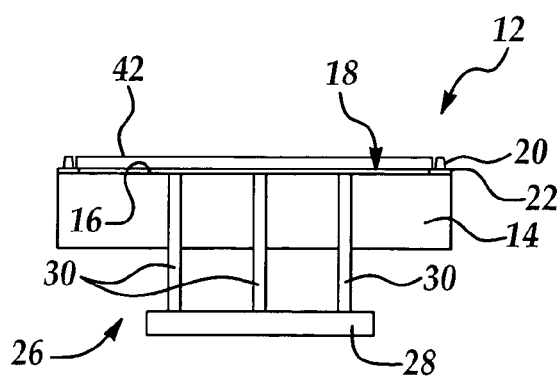
FIG. 3A is a cross-sectional, partially schematic, view of the bake plate of FIG. 1, illustrating a normal position of a wafer on the bake plate in operation of the wafer position detection system of the present invention.
Figure 3B:
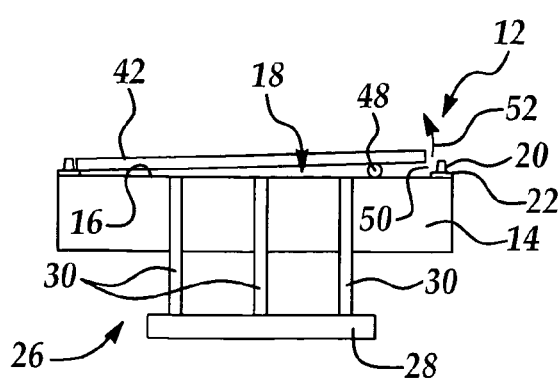
FIG. 3B is a cross-sectional, partially schematic, view of the bake plate of FIG. 1, illustrating an abnormal position of a wafer on the bake plate in operation of the wafer position detection system of the present invention.
Figure 4:
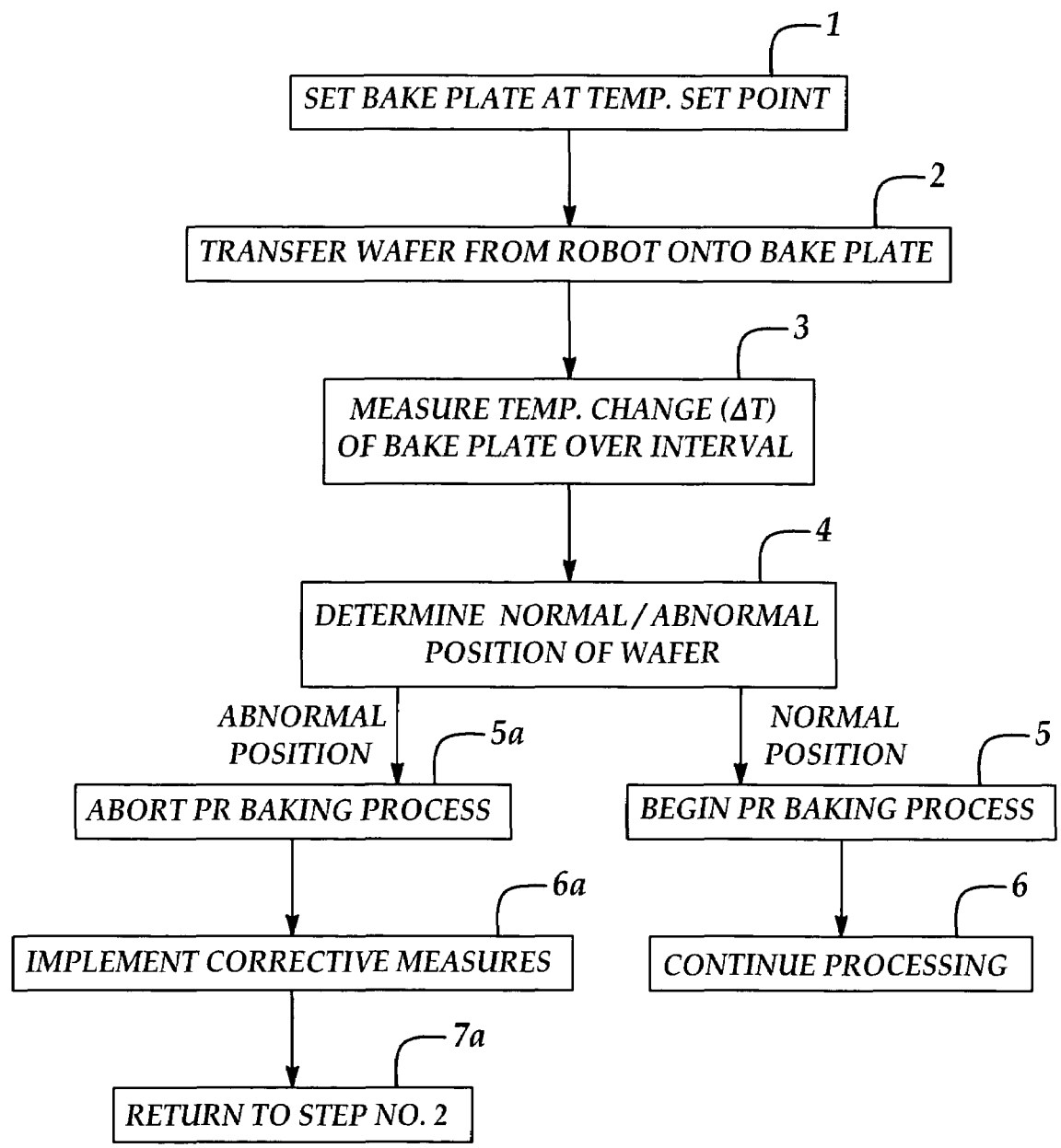
FIG. 4 is a flow diagram illustrating sequential process steps according to the wafer position-detecting method of the present invention.

Referring next to FIGS. 2–4, typical operation of the system 10 is as follows. First, as indicated in step 1 of FIG. 4, the selected set point temperature for the bake plate 12 is initially programmed typically into the track system controller 36. Accordingly, the track system controller 36 begins to heat the bake plate 12 to the set point temperature. However, the bake plate 12 can be maintained at the set point temperature only if a wafer 42 is subsequently positioned on the base 22 in a proper manner to close and prevent excess heat from escaping the heating space 18. Therefore, the temperature of the bake plate 18 typically stabilizes at a few degrees below the set point temperature.

Once the temperature of the bake plate 18 stabilizes below the set point temperature, the track system controller 36 actuates the wafer transfer robot 38 to transfer the wafer 42 onto the bake plate 12, as indicated in step 2 of FIG. 4. Next, as shown in step 3, the temperature-sensing apparatus 26 measures the change in temperature (ΔT) of the heating surface 16 which occurs during a selected time interval (typically 10 seconds) after placement of the wafer 42 onto the bake plate 12. During the selected time interval, the ΔT of the heating surface 16 is continually transmitted from the temperature-sensing apparatus 26 to the microprocessor 34 as a temperature data signal 44. Upon expiration of this time interval, the track system controller 36 transmits a "transfer finish" trigger signal 46 to the microprocessor 34 to notify the microprocessor 34 that the transfer operation has been completed.

As indicated in step 4 of FIG. 4, the microprocessor 34 uses the ΔT data obtained from the temperature data signal 44 over the selected time interval to determine whether the wafer 42 is properly positioned on the bake plate 12. In the event that the wafer 42 is properly positioned on the bake plate 12, as shown in FIG. 3A, the wafer 42 is seated on the base 22 and completely closes the heating space 18. Accordingly, heat radiates by convection upwardly from the heating surface 16, across the heating space 18 to the wafer 42.

Because heat is prevented from escaping the heating space 18, the temperature of the heating surface 16 steadily rises up to the set point temperature. Accordingly, during the selected time interval which follows initial placement of the wafer 42 onto the bake plate 12, the temperature of the heating surface 16 rises by at least 1% of the set point temperature. Thus, a bake plate ΔT of equal to or greater than 1% over the selected time interval is interpreted by the microprocessor 34 as normal positioning of the wafer 42 onto the bake plate 12. (As an example, for a set point temperature of 150 degrees C., the bake plate ΔT must be at least 1.5 degrees C. over the selected time interval to indicate a normal position of the wafer 42). Therefore, the microprocessor 34 allows the track system controller 36 to begin the baking process, as indicated in step 5 of FIG. 4. After completion of the baking process, continued semiconductor fabrication processing is carried out, as indicated in step 6.

As shown in FIG. 3B, due to the presence of particles or a broken wafer piece or pieces 48, for example, on the heating surface 16, the wafer 42 may be abnormally or improperly positioned on the bake plate 12 by the wafer transfer robot 38. Accordingly, the wafer 42 is incompletely seated on the base 22, and a gap 50 is therefore formed between the base 22 and the edge of the wafer 42. Consequently, heat 52 radiates by convection upwardly from the heating surface 16 and escapes from the heating space 18 through the gap 50. Thus, the temperature of the heating surface 16 rises toward the set point temperature at a slower rate than is the case when the wafer 42 is properly positioned on the bake plate 12, as shown and heretofore described with respect to FIG. 3A.

During the selected time interval after initial placement of the wafer 42 onto the bake plate 12, the temperature of the heating surface 16 rises by less than 1% of the set point temperature. Thus, a bake plate ΔT of less than 1% during the selected time interval is interpreted by the microprocessor 34 as abnormal or improper positioning of the wafer 42 on the bake plate 12. (As an example, for a set point temperature of 150 degrees C., the bake plate ΔT must be less than 1.5 degrees C. over the selected time interval to indicate an abnormal or improper position of the wafer 42).

The microprocessor 34 therefore transmits an abort signal 54 to the track system controller 36. As indicated in step 5a of FIG. 4, the track system controller 36, in turn, discontinues or aborts the baking process, such that corrective measures can be made to ensure proper placement of subsequent wafers on the bake plate 12, as indicated in step 6a. After the corrective measures are completed, the procedure returns to step 2, wherein each wafer 42 is transferred from the wafer transfer robot 38 onto the bake plate 12, as indicated in step 7a.

While the preferred embodiments of the invention have been described above, it will be recognized and understood that various modifications can be made in the invention and the appended claims are intended to cover all such modifications which may fall within the spirit and scope of the invention.

What is claimed is:

1. A temperature-sensing wafer position detection system for carrying out a wafer baking process comprising:
   a bake plate having a temperature-sensing apparatus for monitoring a change in temperature of said bake plate heating surface upon placement of a wafer in proximity to said bake plate heating surface;
   a microprocessor in signal communication with said temperature-sensing apparatus for receiving a temperature data signal from said temperature-sensing apparatus to determine a temperature change over time of said bake plate heating surface.

2. The system of claim 1 wherein said temperature-sensing apparatus comprises a plurality of pyrometers arranged for sensing a temperature of said bake plate heating surface.

3. The system of claim 1 further comprising a base carried by said bake plate heating surface and a wafer guide extending upwardly from said base for guiding said wafer onto said base to define a heating space between said bake plate heating surface and said wafer.

4. The system of claim 3 wherein said temperature-sensing apparatus comprises a plurality of pyrometers arranged for sensing a temperature of said bake plate heating surface portion underlying said wafer.

5. The system of claim 1 wherein said bake plate heating surface comprises a base on said heating surface for supporting said wafer in spaced-apart relationship to said heating surface.

6. The system of claim 5 further comprising a wafer guide on said base for guiding said wafer onto said base.

7. The system of claim 1 wherein said temperature-sensing apparatus comprises a plurality of pyrometers extending through a plate body to said bake plate heating surface for sensing a temperature of said base plate heating surface.

8. A temperature-sensing wafer position detection system for carrying out a wafer baking process comprising:
   a bake plate having a temperature-sensing apparatus comprising temperature sensors in proximity to said bake plate heating surface for monitoring a change in temperature of said bake plate heating surface upon placement of a wafer in spaced apart relationship to said bake plate heating surface to define a heating space;
   a controller in signal communication with said bake plate for controlling said wafer baking process in response to said detected wafer position; and,
   a microprocessor in signal communication with said temperature-sensing apparatus for receiving a temperature data signal from said temperature-sensing apparatus, said microprocessor programmed for determining a temperature change over time of said bake plate heating surface to detect said wafer position;
   said microprocessor further in signal communication with said controller for sending a signal to said controller in response to said temperature change to control said wafer baking process.

9. The system of claim 8 wherein said bake plate heating surface comprises a base carried by said heating surface for supporting the wafer in spaced-apart relationship to said heating surface.

10. The system of claim 8 wherein said temperature sensors comprises a plurality of pyrometers in proximity to said heating surface.

11. The system of claim 9 further comprising a wafer guide carried by said base for guiding the wafer onto said base.

12. A method of sensing a position of a wafer on a bake plate to improve a wafer baking process, comprising:
   setting said bake plate heating surface at about a temperature set point prior to carrying out said wafer baking process;
   placing said wafer in proximity to said bake plate heating surface;

then determining a change in temperature of said bake plate heating surface over a specified time interval according to temperature sensors;

then determining said wafer position with respect to said bake plate heating surface in response to said change in temperature; and, determining a subsequent process step in response to said wafer position selected from the group consisting of aborting said wafer baking process and proceeding with said wafer baking process.

13. The method of claim 12 wherein the step of determining said wafer position comprises determining said wafer is properly positioned wherein said change in temperature is at least as great as a predetermined threshold value for said change in temperature.

14. The method of claim 13 wherein said threshold value is one percent of said set point temperature.

15. The method of claim 14 wherein said specified time interval is 10 seconds.

16. The method of claim 12 wherein the step of determining said wafer position comprises determining said wafer is properly positioned wherein said change in temperature is less than a predetermined threshold value for said change in temperature.

17. The method of claim 16 wherein said threshold value is one percent of said set point temperature.

18. The method of claim 17 wherein said specified time interval is 10 seconds.

19. The method of claim 16, wherein said change in temperature is greater for an acceptable wafer position relative to an unacceptable wafer position.

20. The system of claim 1, further comprising a controller in signal communication with said microprocessor for controlling said wafer baking process in response to said temperature change.

* * * * *